United States Patent
Chen

(10) Patent No.: US 8,322,679 B2
(45) Date of Patent: Dec. 4, 2012

(54) CONTAINER DATA CENTER

(75) Inventor: Tsung-Yuan Chen, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/193,592

(22) Filed: Jul. 28, 2011

(65) Prior Publication Data

US 2012/0194046 A1 Aug. 2, 2012

(30) Foreign Application Priority Data

Jan. 27, 2011 (TW) .............................. 100103191 A

(51) Int. Cl.
*F16M 13/00* (2006.01)
(52) U.S. Cl. ......... 248/562; 248/636; 248/576; 361/690
(58) Field of Classification Search .................. 248/562, 248/636, 564, 565, 570, 576; 361/690, 695, 361/698, 699
See application file for complete search history.

(56) References Cited

U.S. PATENT DOCUMENTS

| | | | | |
|---|---|---|---|---|
| 2,597,800 A * | 5/1952 | Hussman | ..................... | 248/565 |
| 4,699,257 A * | 10/1987 | Lloyd | ......................... | 188/380 |
| 4,865,515 A * | 9/1989 | Dorner et al. | .............. | 414/788.2 |
| 6,923,298 B2 * | 8/2005 | Tanner | .......................... | 188/267 |
| 7,187,543 B2 * | 3/2007 | Zimlin | ..................... | 361/679.34 |
| 7,286,355 B2 * | 10/2007 | Cheon | .......................... | 361/699 |
| 7,511,960 B2 * | 3/2009 | Hillis et al. | ................... | 361/702 |
| 7,837,183 B2 * | 11/2010 | Ohki | ........................ | 267/140.11 |
| 7,852,213 B2 * | 12/2010 | Browning et al. | ........... | 340/555 |
| 7,854,652 B2 * | 12/2010 | Yates et al. | ..................... | 454/184 |
| 7,856,838 B2 * | 12/2010 | Hillis et al. | .................. | 62/259.2 |
| 8,000,103 B2 * | 8/2011 | Lipp et al. | ..................... | 361/702 |
| 2008/0218970 A1 * | 9/2008 | Kehret et al. | ................. | 361/699 |
| 2010/0110634 A1 * | 5/2010 | Woodbury et al. | ............ | 361/698 |

* cited by examiner

*Primary Examiner* — Terrell McKinnon
*Assistant Examiner* — Monica Millner
(74) *Attorney, Agent, or Firm* — Altis Law Group, Inc.

(57) ABSTRACT

A container data center includes a container, a number of shock absorbers installed in the container, and a support plate installed on the shock absorbers. Each shock absorber includes a support bracket and two damping elements positioned at opposite ends of the support bracket. Each damping element includes a first connecting end fixed to a corresponding end of the support bracket, and a second connecting end fixed to the container. The first connecting ends of the damping elements are movable relative to the corresponding second ends of the damping elements through overcoming resistance. The support plate is installed on the support bracket and can support a number of servers.

5 Claims, 3 Drawing Sheets

CONTAINER DATA CENTER

BACKGROUND

1. Technical Field

The present disclosure relates to a container data center.

2. Description of Related Art

A container data center usually includes a container, and many server racks each holding many servers and received in the container. However, during transportation of the container data center, the servers may be damaged due to vibrations or shaking.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
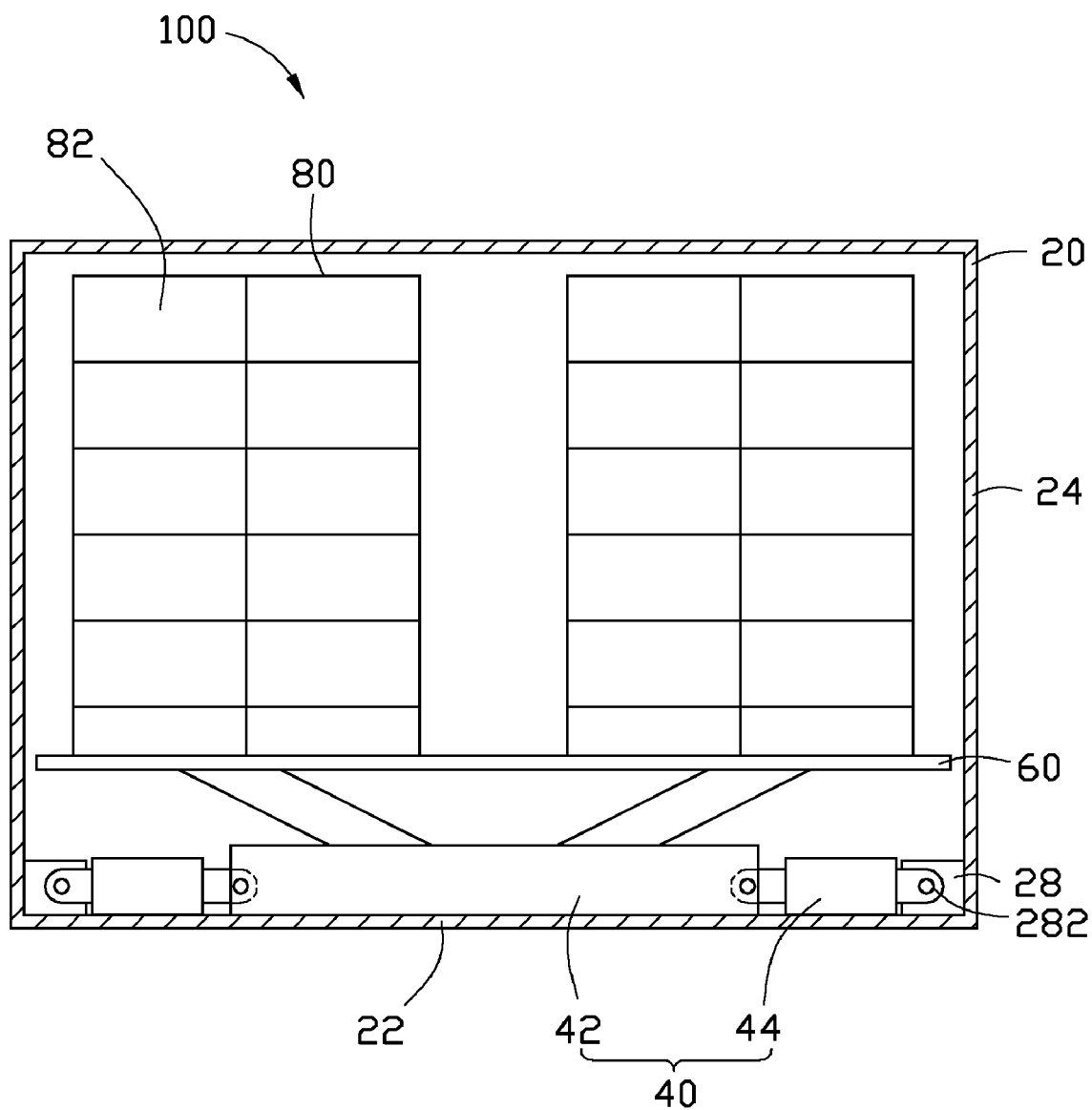
FIG. 1 is a cross-sectional view of an exemplary embodiment of a container data center, wherein the container data center includes a support bracket and two dampers.

Referring to FIG. 1, an embodiment of a container data center 100 includes a container 20, a plurality of shock absorbers 40, a support plate 60, and a plurality of racks 80 fixed on the support plate 60. Many electronic devices 82 are installed in the racks 80. In the embodiment, the electronic devices 82 are servers.

The container 20 includes a rectangular bottom wall 22, and two opposite sidewalls 24 extending in a substantially perpendicular manner from two opposite sides of the bottom wall 22. A plurality of pairs of fixing blocks 28 are fixed on the bottom wall 22. The fixing blocks 28 of each pair are respectively adjacent to the two opposite sidewalls 24. A fixing hole 282 is defined in each fixing block 28, extending along a direction parallel to the bottom wall 22 and the sidewalls 24.

Each shock absorber 40 includes a substantially K-shaped support bracket 42 and two dampers 44.

Figure 2:
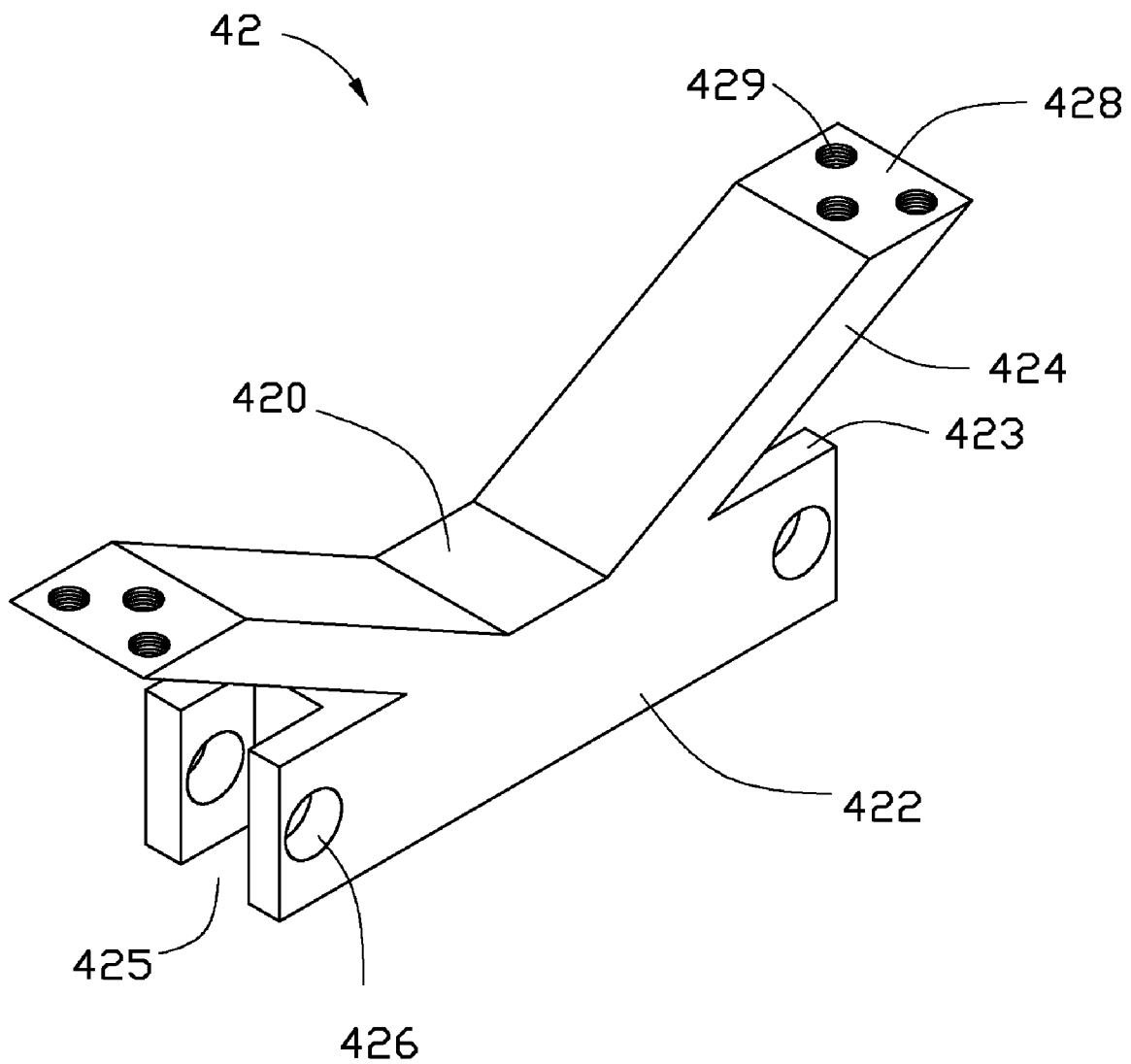
FIG. 2 is an enlarged, isometric view of the support bracket of FIG. 1.

Referring to FIG. 2, the support bracket 42 includes a substantially rectangular base 420, and two slanted support arms 424 symmetrically extending from a middle of a top surface 423 of the base 420. The base 420 includes two opposite side surfaces 422, and the top surface 423 is connected between tops of the side surfaces 422. Two cutouts 425 are defined in two opposite ends of the base 420, extending through the top surface 423, a bottom surface of the base 420 opposite to the top surface 423, and a corresponding end surface. Two through holes 426 are defined in opposite ends of the side surfaces 423, respectively, communicating with the corresponding cutouts 425. Each support arm 424 includes a supporting surface 428 at a distal end of the support arm 424 opposite to the base 420. The supporting surface 428 is parallel to the top surface 423. A plurality of screw holes 429 is defined in the supporting surface 428.

Figure 3:
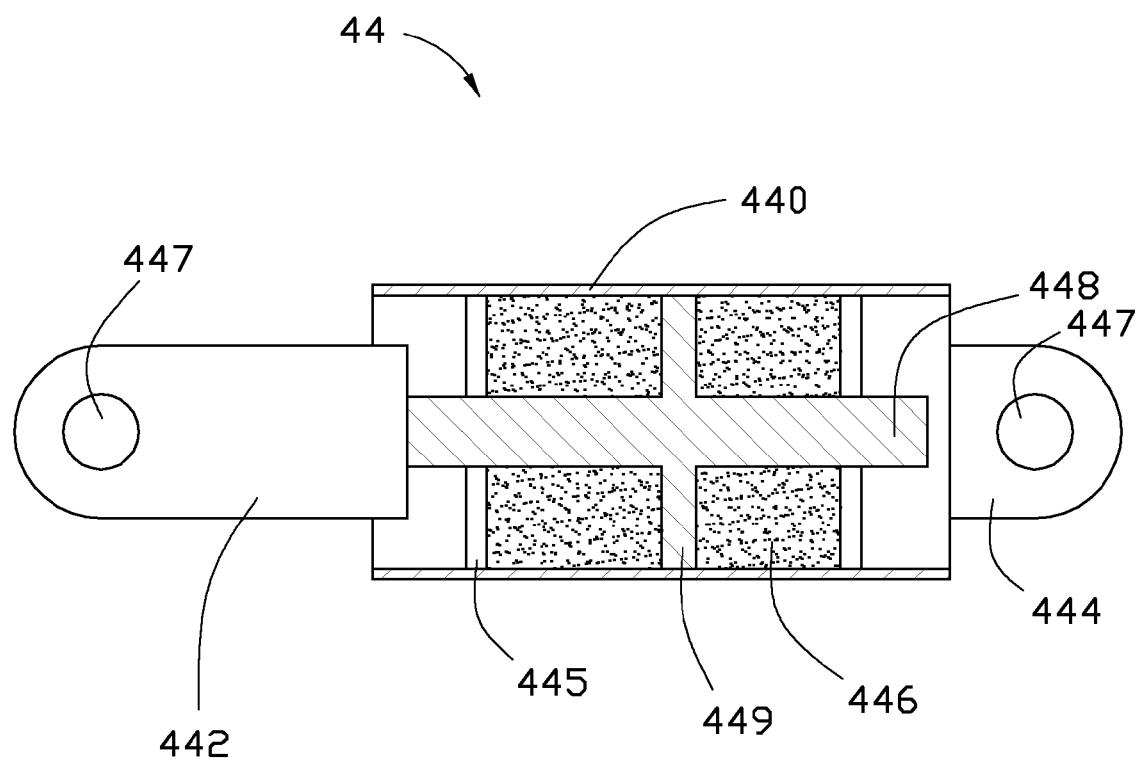
FIG. 3 is an enlarged, cross-sectional view of one of the dampers of FIG. 1.

Referring to FIG. 3, each damper can absorb energy of vibration or shaking through a damping structure. In one embodiment, each damper 44 includes a cylinder 440, a piston 449 slidably received in the cylinder 440, two seal members 445 respectively fixed to two opposite ends of the cylinder 440, and damping material 446 filled in the cylinder 440 between the piston 449 and the seal members 445. A substantially bar-shaped piston rod 448 extends in a substantially perpendicular manner from a middle of the piston 449, with two opposite ends of the piston rod 448 respectively slidably extending through the seal members 445. A first connecting end 442 extends from a distal end of the piston rod 448. A second connecting end 444 extends from an end of the cylinder 440 opposite to the first connecting end 442. A connecting hole 447 is defined in a distal end of each of the first connecting end 442 and the second connecting end 444. In the embodiment, the damper 44 is a viscous damper.

The support plate 60 is substantially rectangular. A plurality of fastening holes (not shown) is defined in the support plate 60.

In assembly, the first connecting ends 442 of two dampers 44 are respectively received in the cutouts 425. The connecting holes 447 of the dampers 44 respectively align with the corresponding through holes 426. Two fasteners are respectively inserted into the through holes 426 and the connecting holes 447. The dampers 44 are respectively fixed to the corresponding ends of the base 420. The shock absorbers 40 are supported on the bottom plate 22, each between a different pair of fixing blocks 28. The connecting holes 447 of each shock absorber 40 are aligned with the fixing holes 282 of the corresponding fixing blocks 28. Two fasteners are respectively inserted into the connecting holes 447 and the fixing holes 282 to fix the shock absorber 40 to the fixing blocks 28. The support plate 60 is supported on the supporting surfaces 428 of the shock absorbers 40, with the fastening holes of the support plate 60 respectively aligning with the screw holes 429. Fasteners extend through the fastening holes of the support plate 60 to screw in the corresponding screw holes 429. Server racks 80 are fixed on the support plate 60 by screws or other fasteners.

When the container 20 shakes, the opposite ends of the base 420 of the support brackets 42 pull or push the first connecting ends 442 of the dampers 44, and the pistons 449 are moved in the cylinders 440. The damping material 446 absorbs energy of the shaking.

In other embodiments, the dampers 44 can be replaced by resilient members, such as springs, which can absorb energy of vibrations.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A container data center comprising:
    a container;
    a shock absorber installed in the container, and comprising a support bracket and at least one damping element, each of the at least one damping element comprising a first connecting end connected to the support bracket, and a second connecting end connected to the container, wherein the first connecting end is movable relative to the second end; and a support plate installed on the support bracket, operable to support a plurality of servers;

wherein the at least one damping element is at least one viscous damper; each of the at least one damper comprises a cylinder, a piston slidably received in the cylinder, two seal members respectively fixed to opposite ends of the cylinder, and damping material filled in the cylinder and between the piston and the seal members, a piston rod extends from the piston, with two opposite ends of the piston rod respectively extending through the seal members, the first connecting end extends from one of the ends of the piston rod, the second connecting end extends from an end of the cylinder opposite to the first connecting end.

2. The container data center of claim 1, wherein the container comprises a bottom wall, two fixing blocks extending from opposite ends of the bottom wall, the at least one damping element comprises two damping elements, the first connecting ends of the damping elements are fixed to the corresponding ends of the support bracket, and the second connecting ends of the damping elements are fixed to the fixing blocks, respectively.

3. The container data center of claim 2, wherein the support bracket comprises a base, two cutouts are defined in opposite ends of the base, and the first connecting ends of the damping elements are respectively received in the cutouts to connect to the corresponding ends of the base.

4. The container data center of claim 3, wherein the support bracket further comprises two slanted arms extending from a top of the base, a supporting surface at a distal end of each arm supports the support plate.

5. The container data center of claim 4, wherein a plurality of fixing holes is defined in the supporting surface, to fix the support plate.

* * * * *